(12) United States Patent
Grossman et al.

(10) Patent No.: US 10,626,910 B2
(45) Date of Patent: Apr. 21, 2020

(54) FASTENER FOR USE WITH ELECTROMAGNETIC INTERFERENCE SHIELDING

(71) Applicant: The Johns Hopkins University, Baltimore, MD (US)

(72) Inventors: Kenneth R. Grossman, Olney, MD (US); Joseph A. Miragliotta, Ellicott City, MD (US); Adam J. Maisano, Sykesville, MD (US); Douglas B. Trigg, Laurel, MD (US)

(73) Assignee: The Johns Hopkins University, Baltimore, MD (US)

( * ) Notice: Subject to any disclaimer, the term of this patent is extended or adjusted under 35 U.S.C. 154(b) by 52 days.

(21) Appl. No.: 16/026,082

(22) Filed: Jul. 3, 2018

(65) Prior Publication Data

US 2019/0072126 A1 Mar. 7, 2019

Related U.S. Application Data

(63) Continuation of application No. 62/554,142, filed on Sep. 5, 2017.

(51) Int. Cl.
 *F16B 43/00* (2006.01)
 *H05K 9/00* (2006.01)
 *A47G 1/20* (2006.01)
 *A47G 1/16* (2006.01)

(52) U.S. Cl.
 CPC ......... *F16B 43/001* (2013.01); *H05K 9/0003* (2013.01); *H05K 9/0088* (2013.01); *A47G 1/16* (2013.01); *A47G 1/20* (2013.01)

(58) Field of Classification Search
 CPC .. F16B 43/001; H05K 9/0003; H05K 9/0088; A47G 1/16; A47G 1/20
 See application file for complete search history.

(56) References Cited

U.S. PATENT DOCUMENTS

2013/0259604 A1* 10/2013 Whitlock ................ F16B 33/06
 411/500

\* cited by examiner

*Primary Examiner* — John C Hong
(74) *Attorney, Agent, or Firm* — Noah J. Hayward

(57) ABSTRACT

A fastener is configured to maintain electromagnetic interference characteristics of metamaterial shielding. The fastener includes a head having an interior side and an exterior side, a shank extending from the interior side of the head and configured to be driven into a receiving surface, and a seal being formed as a loop and disposed on the interior side of the head. The seal may include a conductive material.

18 Claims, 14 Drawing Sheets

FASTENER FOR USE WITH ELECTROMAGNETIC INTERFERENCE SHIELDING

CROSS REFERENCE TO RELATED APPLICATIONS

This application claims priority to and the benefit of prior-filed, U.S. Provisional Application No. 62/554,142 filed on Sep. 5, 2017, the entire contents of which are incorporated herein by reference.

STATEMENT OF GOVERNMENTAL INTEREST

This invention was made with Government support under contract number FA8222-16-C-0005 awarded by the U.S. Air Force. The Government has certain rights in the invention.

TECHNICAL FIELD

Example embodiments generally relate to the propagation of electromagnetic fields and waves and, in particular, relate to systems and apparatuses for absorbing or attenuating fields and waves.

BACKGROUND

With the increased use of radio communication devices, it has become increasingly important to be able to construct physical structures (e.g., buildings and, in particular, interior spaces of buildings) that operate to limit or eliminate electromagnetic interference internal to the structure. Such physical structures and spaces can offer improved internal communications due to elimination of outside sources. In some instances, radio frequency signals and noise may propagate along surfaces, such as walls and floors, as surface waves. Such surface waves may propagate until they reach certain types of discontinuities, such as a crack in a door or window frame, and then the surface waves may be re-radiated from the discontinuity and into the open space thereby introducing electromagnetic interference into the structure. Also, information-bearing signals generated inside the structure could escape in a similar fashion permitting the interception of sensitive information by another party, for example, that is external to the structure.

Engineered metamaterials that operate as electromagnetic interference (EMI) shields to absorb or attenuate radio frequency (RF) surface waves offer one solution for inhibiting re-radiation in such spaces. In some instances, these metamaterials may be implemented in the form of a wall covering for interior walls. However, the application of fixtures that pierce the metamaterial (e.g., picture frame hangers, hooks, wall anchors, etc.) can affect the metamaterials' ability to attenuate radio frequency waves and thus may create weaknesses in the metamaterial that can permit re-radiation of the waves. Accordingly, it would be desirable to provide a means for applying fixtures to metamaterial wall coverings without affecting the radio frequency attenuation abilities of the metamaterial.

BRIEF SUMMARY OF SOME EXAMPLES

According to some example embodiments, a fastener configured to maintain electromagnetic interference characteristics of metamaterial shielding is provided. The fastener may comprise a head having an interior side and an exterior side, a shank extending from the interior side of the head and configured to be driven into a receiving surface, and a seal being formed as a loop and disposed on the interior side of the head, the seal comprising a conductive material.

According to some example embodiments, another fastener configured to maintain electromagnetic interference characteristics of metamaterial shielding is provided. The fastener may comprise a circular head having an interior side and an exterior side, and a shank extending from the interior side of the head and configured to be driven into a receiving surface. In this regard, at least a portion of the shank may be threaded. The fastener may further comprise a seal being formed as a loop and disposed along a perimeter of the interior side of the head. The seal may comprise a conductive material.

According to some example embodiments, a method for installing a fastener on a receiving surface having metamaterial shielding affixed to the receiving surface in a manner that maintains electromagnetic interference characteristics of a metamaterial shielding is provided. The method may comprise cutting and removing an outer sheathing layer and a patterned conductive layer from a target area of the metamaterial shielding, removing a dielectric layer from the target area of the metamaterial shielding while maintaining a conductive layer of the metamaterial shielding positioned behind the dielectric layer, and driving a shank of the fastener into and through the conductive layer of the metamaterial shielding and into the receiving surface at the target area. In this regard, the fastener may comprise a head having an interior side and an exterior side. The shank may extend from the interior side of the head and the shank may be configured to be driven into a receiving surface. The conductive seal may be formed as a loop and disposed on the interior side of the head. The method may further comprise seating the conductive seal on the conductive layer of the metamaterial shielding such that the fastener physically contacts the conductive layer only via the conductive seal and the shank.

BRIEF DESCRIPTION OF THE SEVERAL VIEWS OF THE DRAWING(S)

Having thus described some example embodiments in general terms, reference will now be made to the accompanying drawings, which are not necessarily drawn to scale, and wherein:

Figure 8:
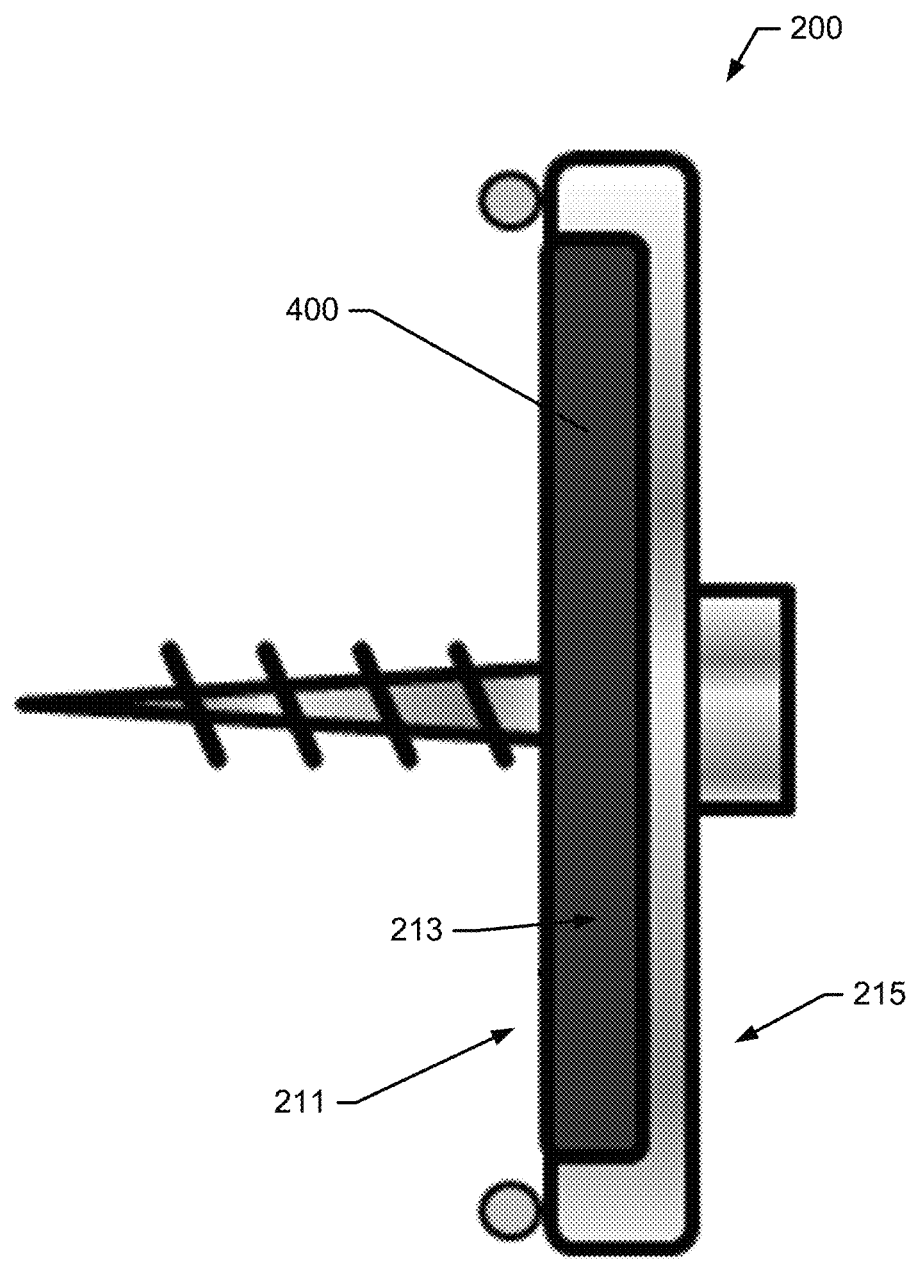
Figure 9:
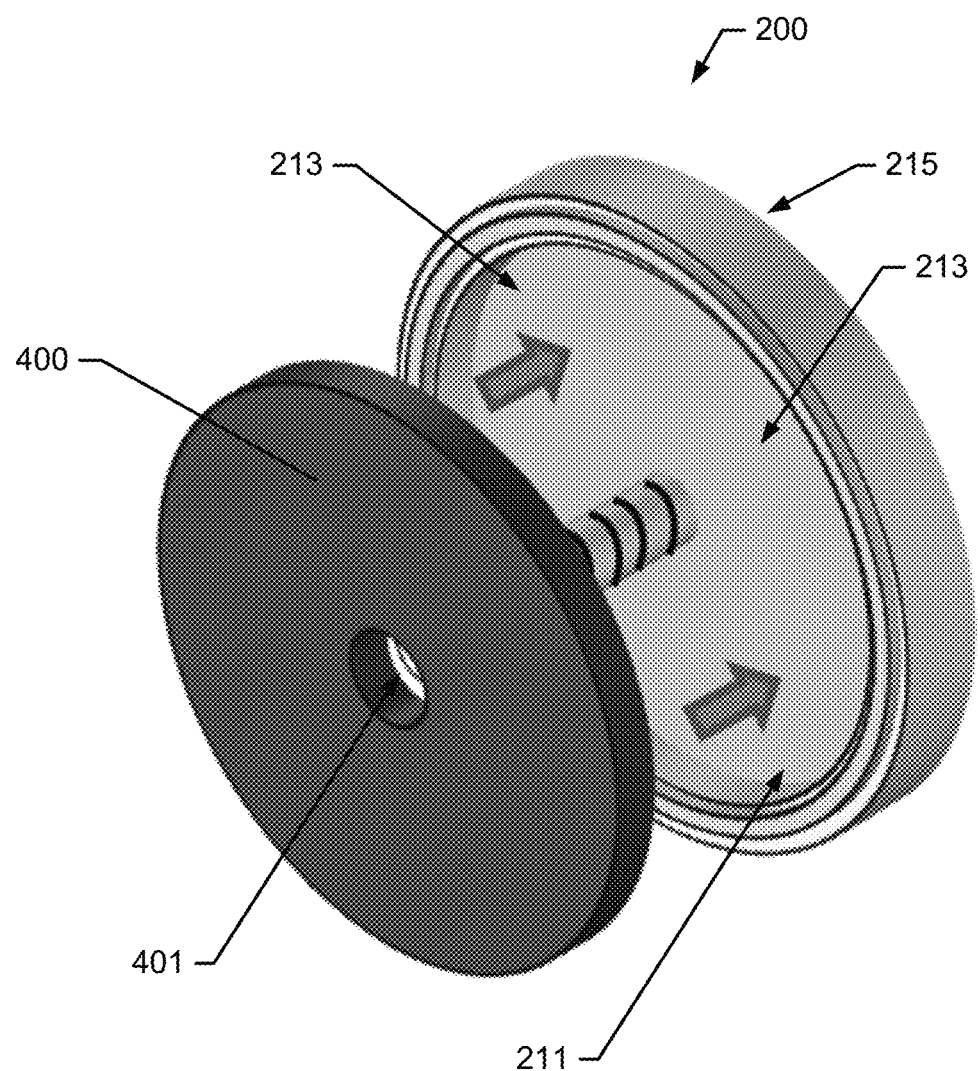
Figure 10:
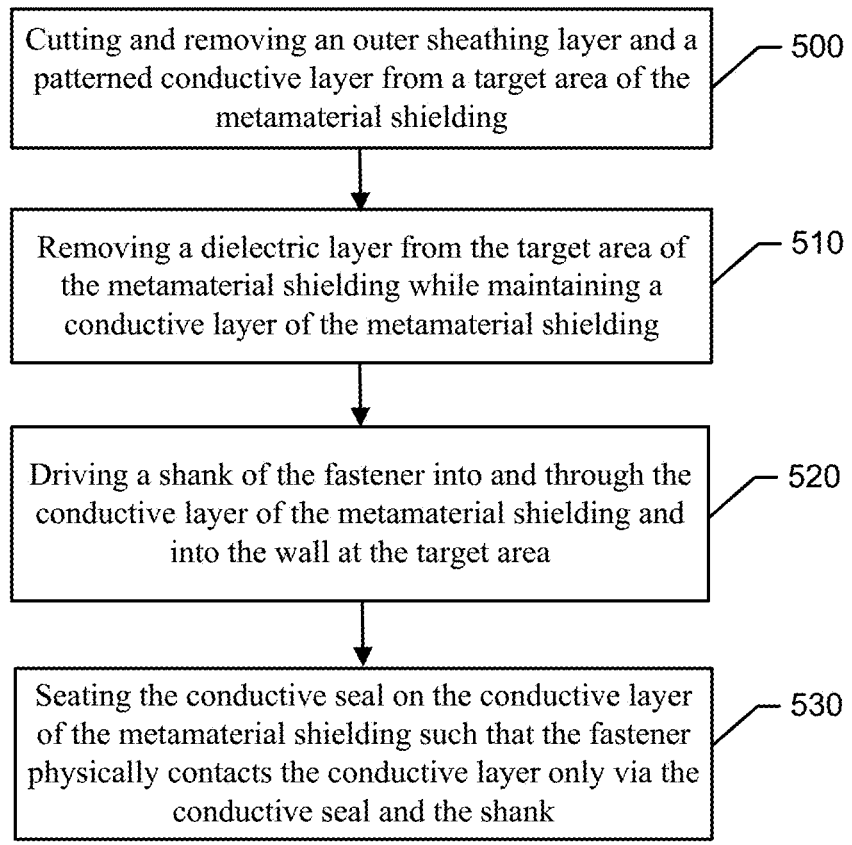
Figure 11:
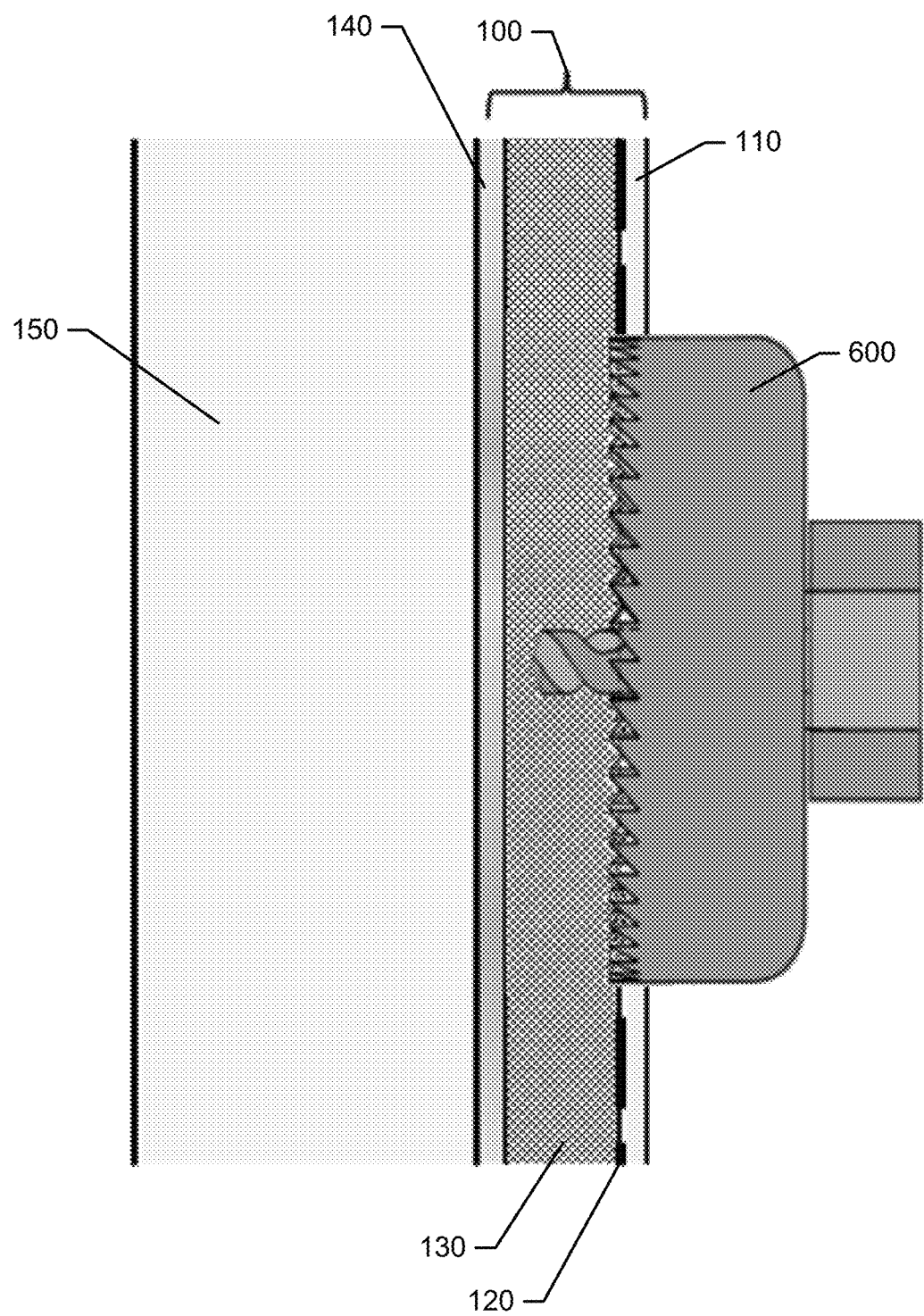
Figure 12:
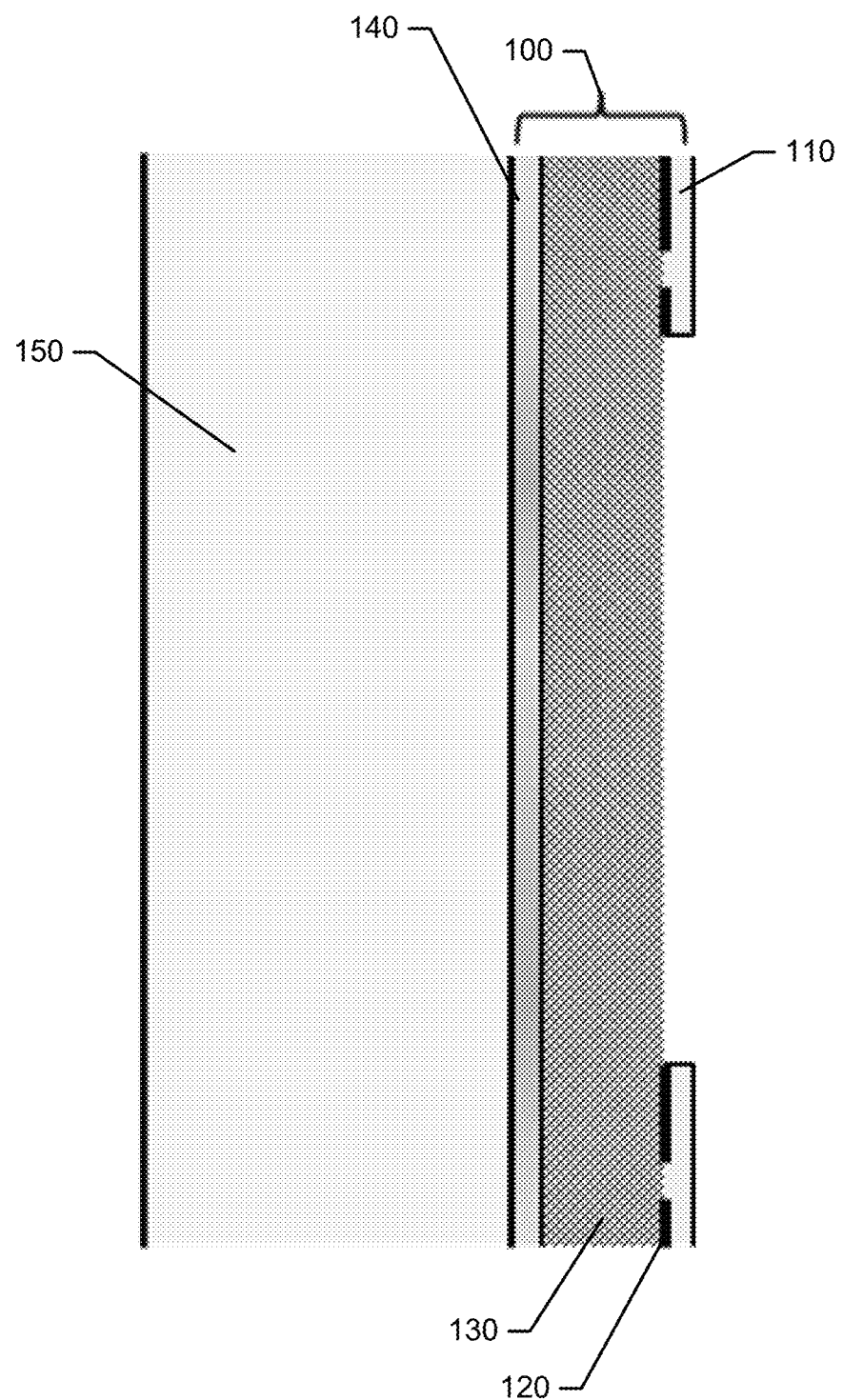
Figure 13:
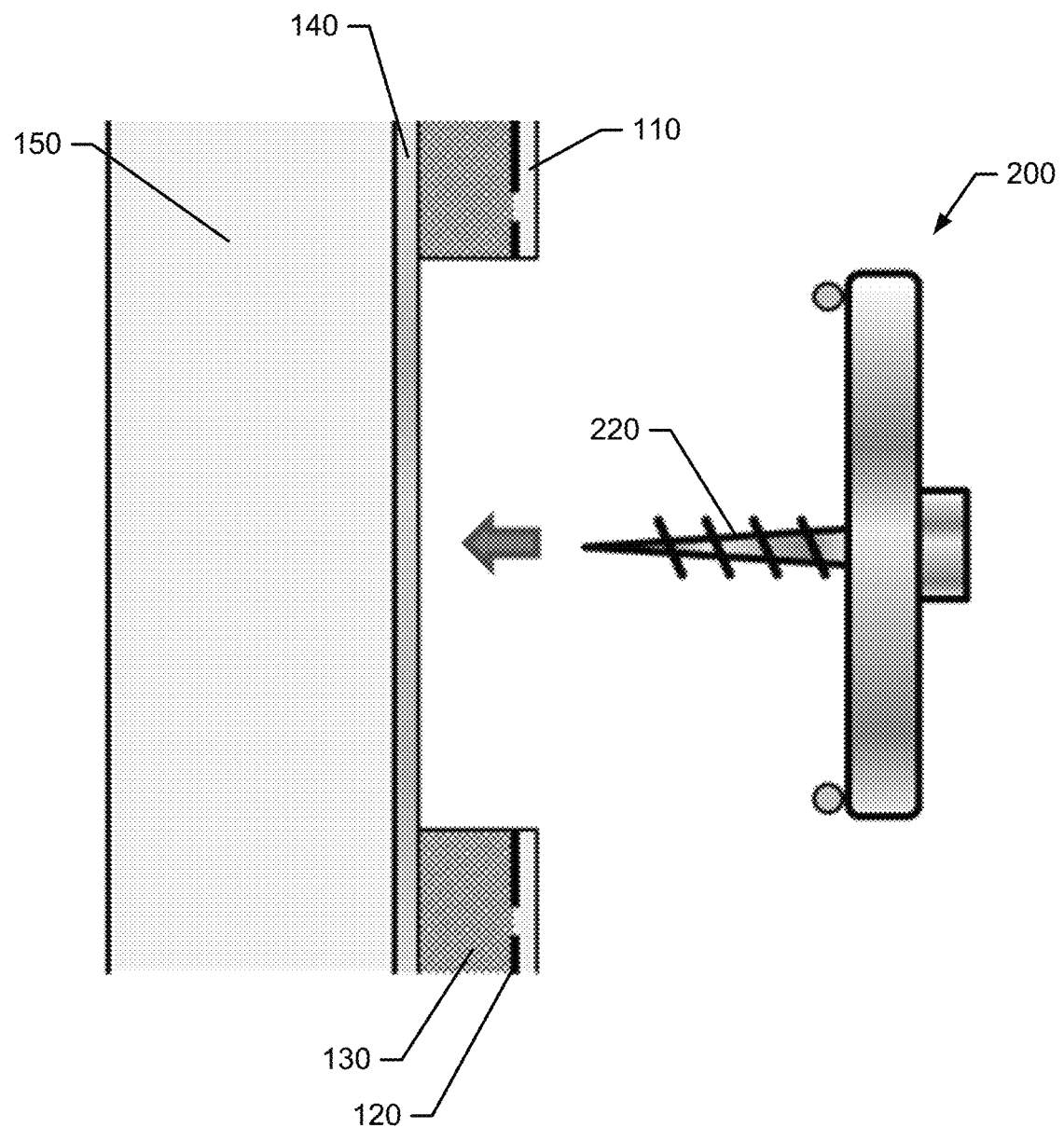
Figure 14:
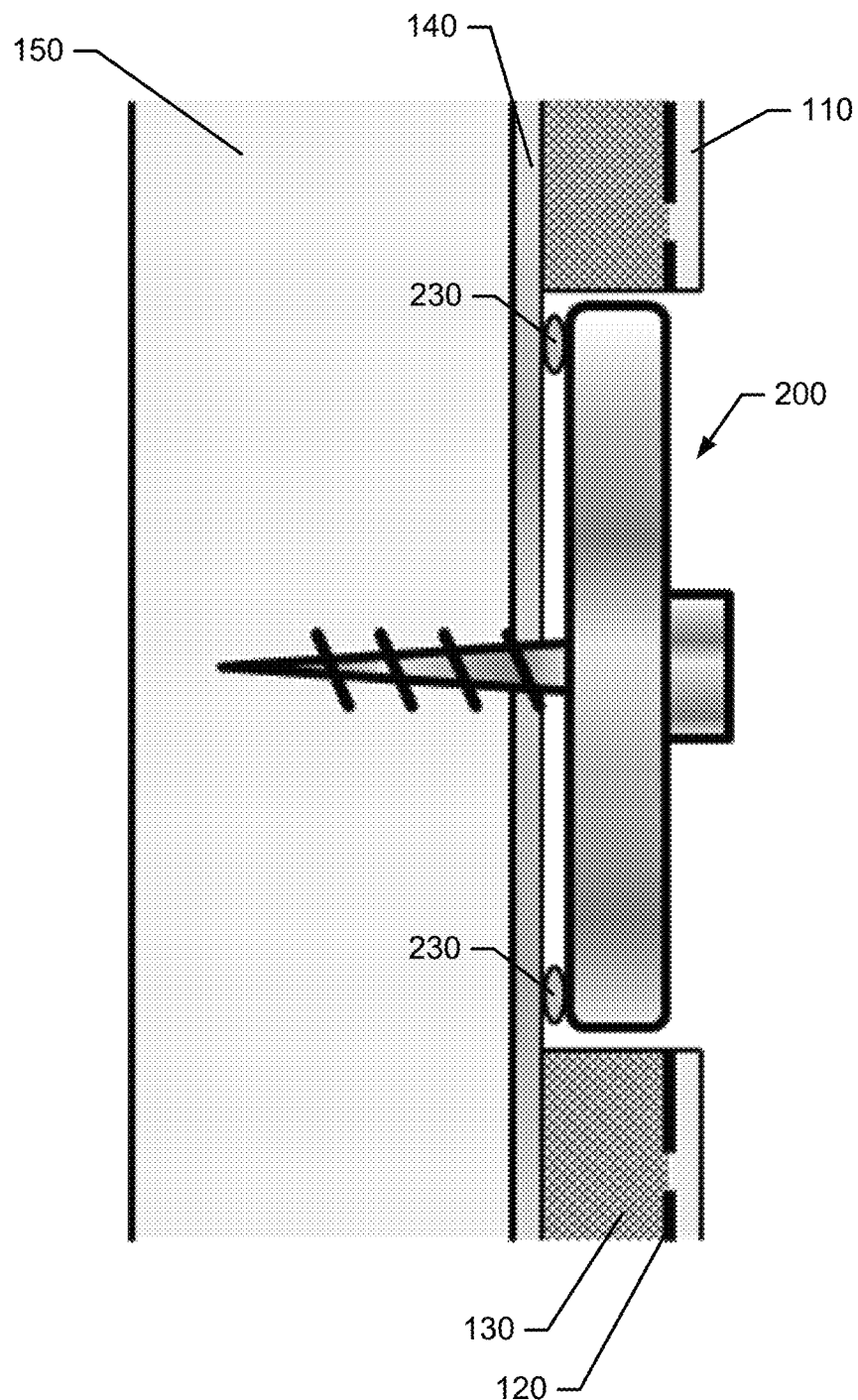

FIG. 8 a cross-section side view of a fastener with an insert according to an example embodiment;

FIG. 9 illustrates a perspective view of an interior side of a fastener with an insert being installed in a cavity of the head of the fastener according to an example embodiment;

FIG. 10 illustrates a flowchart of an example method for installing a fastener to a metamaterial-based EMI shielding according to an example embodiment;

FIG. 11 illustrates a metamaterial-based EMI shielding applied to the wall being cut by a circular cutter according to an example embodiment;

FIG. 12 illustrates a metamaterial-based EMI shielding applied to the wall where an outer sheathing layer and a patterned conductive layer are removed according to an example embodiment;

FIG. 13 illustrates a metamaterial-based EMI shielding applied to the wall where a fastener is being installed according to an example embodiment; and FIG. 14 illustrates a metamaterial-based EMI shielding applied to the wall where a fastener is installed and a seal of the fastener is seated according to an example embodiment.

DETAILED DESCRIPTION

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout. As used herein, operable coupling should be understood to relate to direct or indirect connection that, in either case, enables functional interconnection of components that are operably coupled to each other.

As discussed above, metamaterial-based EMI shielding may be used to inhibit the propagation of RF waves within a space by, for example, applying the shielding to a receiving surface in the space, such as, for example, walls, ceilings, or floors. However, the application of shielding to these receiving surfaces can limit the usability and flexibility of the space because piercing the shielding to, for example, hang a fixture or item on a wall or from a ceiling can cause a leakage path to RF waves in the shielding. To overcome this technical problem, an example fastener is provided that operates to eliminate the leakage path that may be created when piercing the shielding, while also offering the ability to, for example, hold a hook to hang a painting or picture.

An example fastener, according to some example embodiments, may include a conductive seal that, when applied, surrounds a hole formed in the shielding by placing the conductive seal in continuous contact with a conductive layer of the shielding. In this regard, the conductive seal may be affixed on an interior side (or wall/receiving surface facing side) of a fastener head and surround a shank of the fastener. The shank may be configured to pierce the shielding and be driven through the shielding and into the receiving surface to secure the fastener to the receiving surface. According to some example embodiments, once installed, a threaded opening on the external side (or non-wall/non-receiving surface facing side) of the head of the fastener may be used to hold a hook or other accessory onto the receiving surface.

Figure 1:
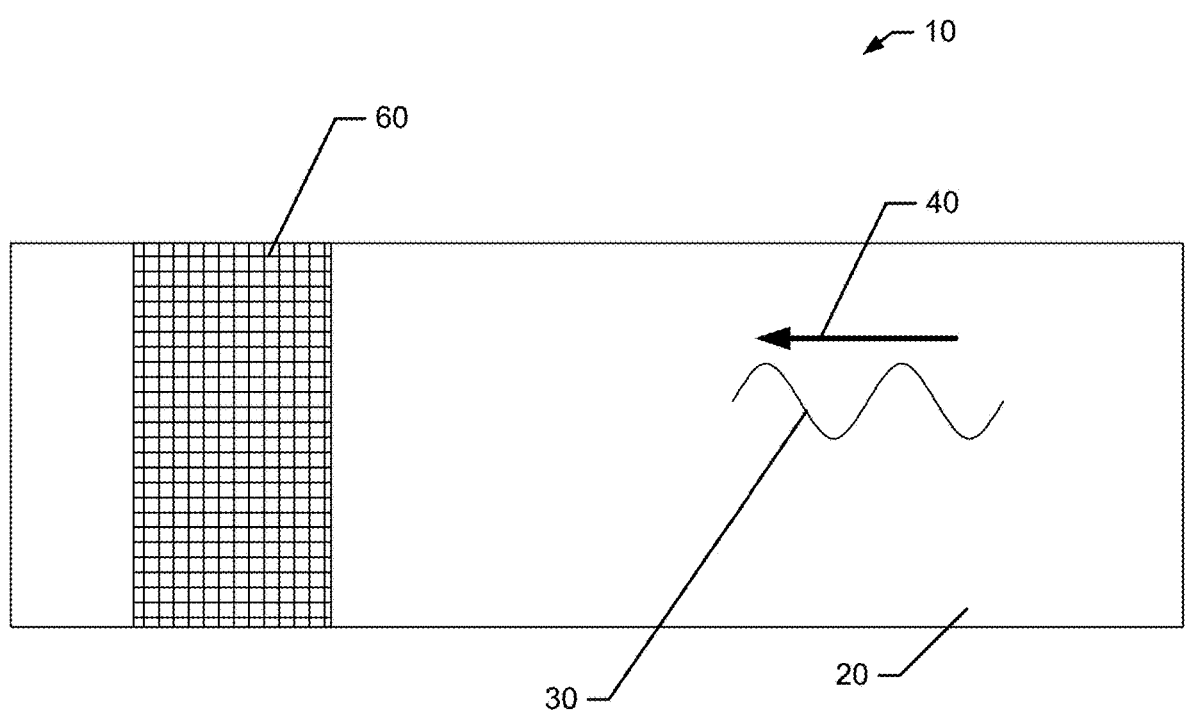
FIG. 1 illustrates an example surface wave propagating across a surface according to an example embodiment.

In light of the forgoing, FIG. 1 illustrates an example space 10 with a receiving surface 20 (e.g., a wall) that has been subjected to, for example, a radio frequency surface wave 30. In this regard, radio frequency surface wave 30 may be propagating in one or more directions (e.g., in a direction 40 that is substantially from right to left as viewed in FIG. 1). A metamaterial-based EMI shielding 60 has been applied to the receiving surface 20. The metamaterial-based EMI shielding 60 may inhibit the propagation of RF waves, such as radio frequency surface wave 30. As such, the radio frequency surface wave 30 may be prevented from propagating and the energy of the wave 30 may be, for example, absorbed or attenuated. Accordingly, electromagnetic interference that could have been released into the space 10 by the radio frequency surface wave 30 is prevented from radiating by operation of the shielding 60. However, if a need arises to pierce the shielding 60 to, for example, add a hook to the receiving surface 20, a discontinuity in the shielding 60 may be formed that creates an RF leakage point in the shielding 60.

Figure 2:
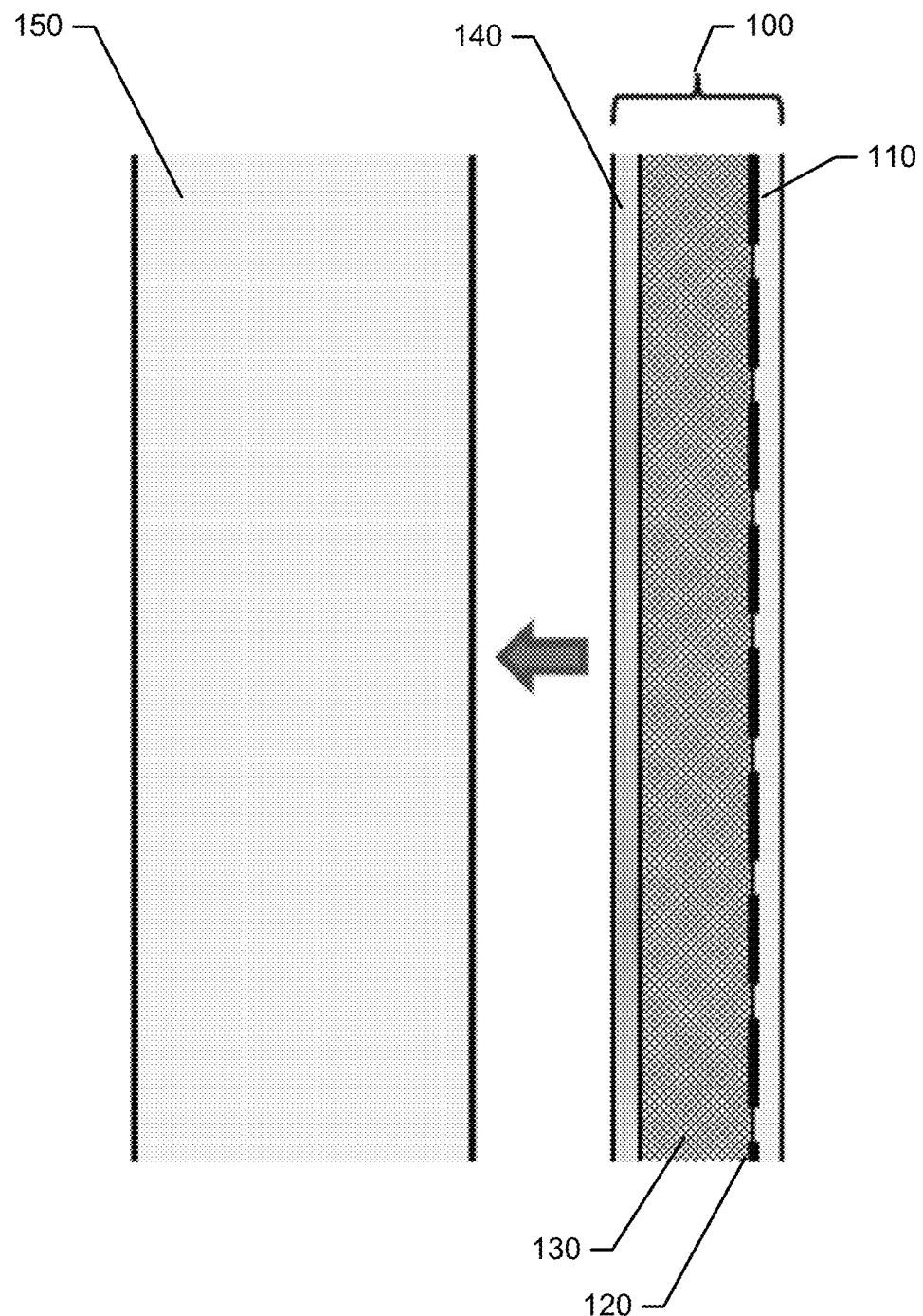
FIG. 2 illustrates a side cross-section view of a receiving surface in the form of a wall and metamaterial-based EMI shielding to be applied to the wall according to an example embodiment.
Figure 3:
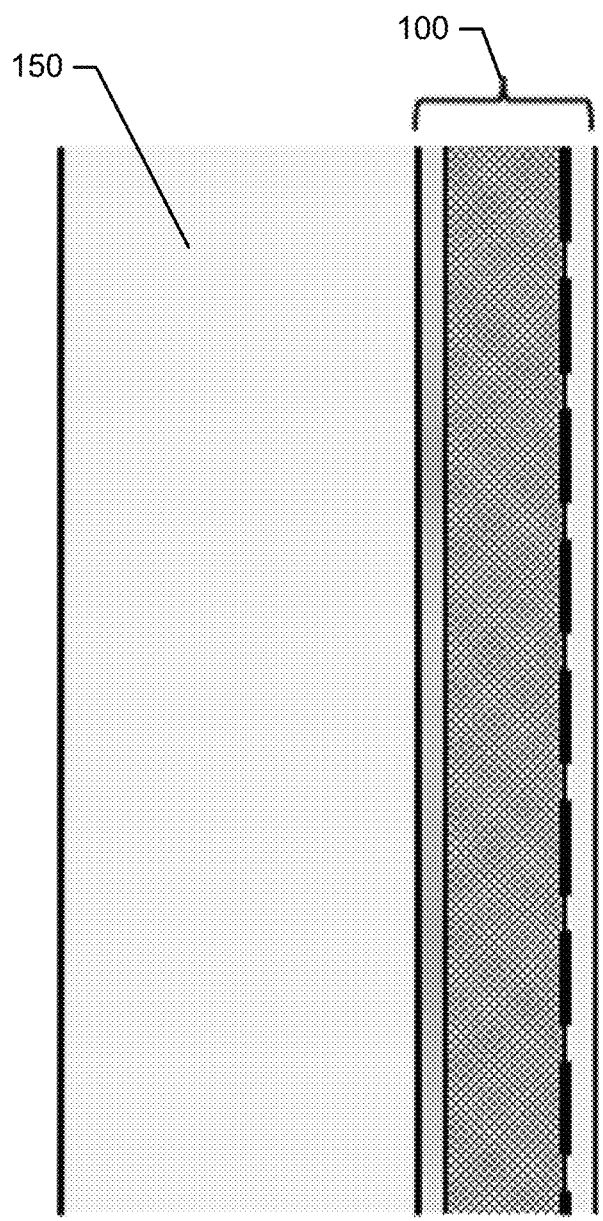
FIG. 3 illustrates a side cross-section view of a wall and metamaterial-based EMI shielding applied to the wall according to an example embodiment.

FIG. 2 shows a cross-section side view of example metamaterial-based EMI shielding 100 being applied to a receiving surface 150. In this regard, the shielding 100 may be in the form of a sheet that may be applied to the receiving surface 150. The receiving surface 150 may be a framed wall, which may be covered in drywall or wallboard, such as SHEETROCK®. According to various example embodiments, the shielding 100 may be comprised of, listed in order starting from an exterior side towards an interior or wall-side, an outer sheathing layer 110, a patterned conductive layer 120, a dialectic layer, and a conductive layer 140. As shown in FIG. 2, the shielding 100, as constructed, may be applied to a receiving surface 150 as indicated by the arrow. FIG. 3 shows a side cross-section view of the receiving surface 150 and metamaterial-based EMI shielding 100.

In this regard, the outer sheathing layer 110 may be comprised of, for example, drywall or wallboard, such as SHEETROCK® or the like, and may operate as a protective layer that can prevent damage to the other inner layers of the shielding 100. The outer sheathing layer 110 may be the most mechanically robust component of the metamaterial-based EMI shielding 100.

Further, the patterned conductive layer 120 may be formed as a conductive mesh that is, for example, closely adhered to the interior side of the outer sheathing layer 110. The patterned conductive layer 120 may be a relatively thin layer that is closely adhered to or otherwise integrated with the outer sheathing layer 110.

The dielectric layer 130 may be the thickest layer of the shielding 100 and may be formed of an insulator. According to some example embodiments, the dielectric layer 130 may be comprised of a foam-based substance and therefore may be mechanically weaker than, for example, the outer sheathing layer 110. For example, according to some example embodiments, the dielectric layer 130 may comprise an open celled foam impregnated with a carbon coating. The dielectric layer 130 may operate as an insulating buffer between the patterned conductive layer 120 and the conductive layer 140.

The conductive layer 140 may be a continuous layer of conductive material (e.g., metal, metal alloy, or the like) that is configured to assist with attenuating or absorbing RF waves. The conductive layer 140 may be disposed on an interior side of the dielectric layer 130, and, when applied to a wall, the conductive layer 140 may disposed in position external to and adjacent to the wall. In example embodiments where the shielding 100 is formed in sheets that are applied to the receiving surfaces of a space, the conductive layer 140 of each sheet may be electrically coupled (e.g., physically connected) such that electrical continuity exists between the conductive layer 140 of each sheet. Any damage or piercings of the conductive layer 140 may lead to the possibility of leakage of RF waves. As such, care may be taken to ensure that any piercing of the conductive layer is later remedied. For example, if a wall hanger is needed a particular location on a wall, then a fastener, in accordance with some example embodiments, may be utilized to overcome and alleviate the RF leakage risks that can be associated with piercing the conductive layer 140.

Figure 4:
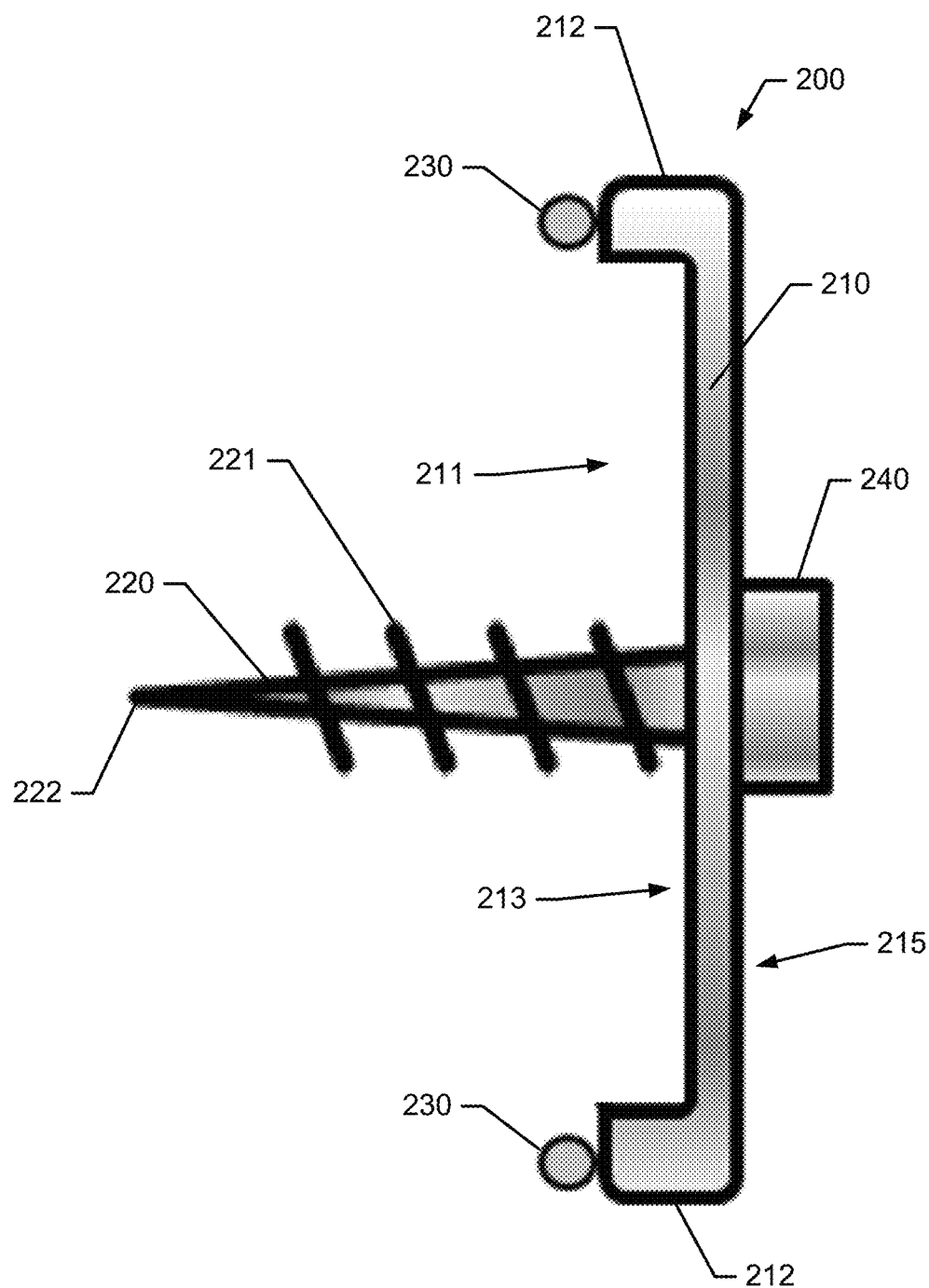
FIG. 4 illustrates a cross-section side view of a fastener according to an example embodiment.
Figure 5:
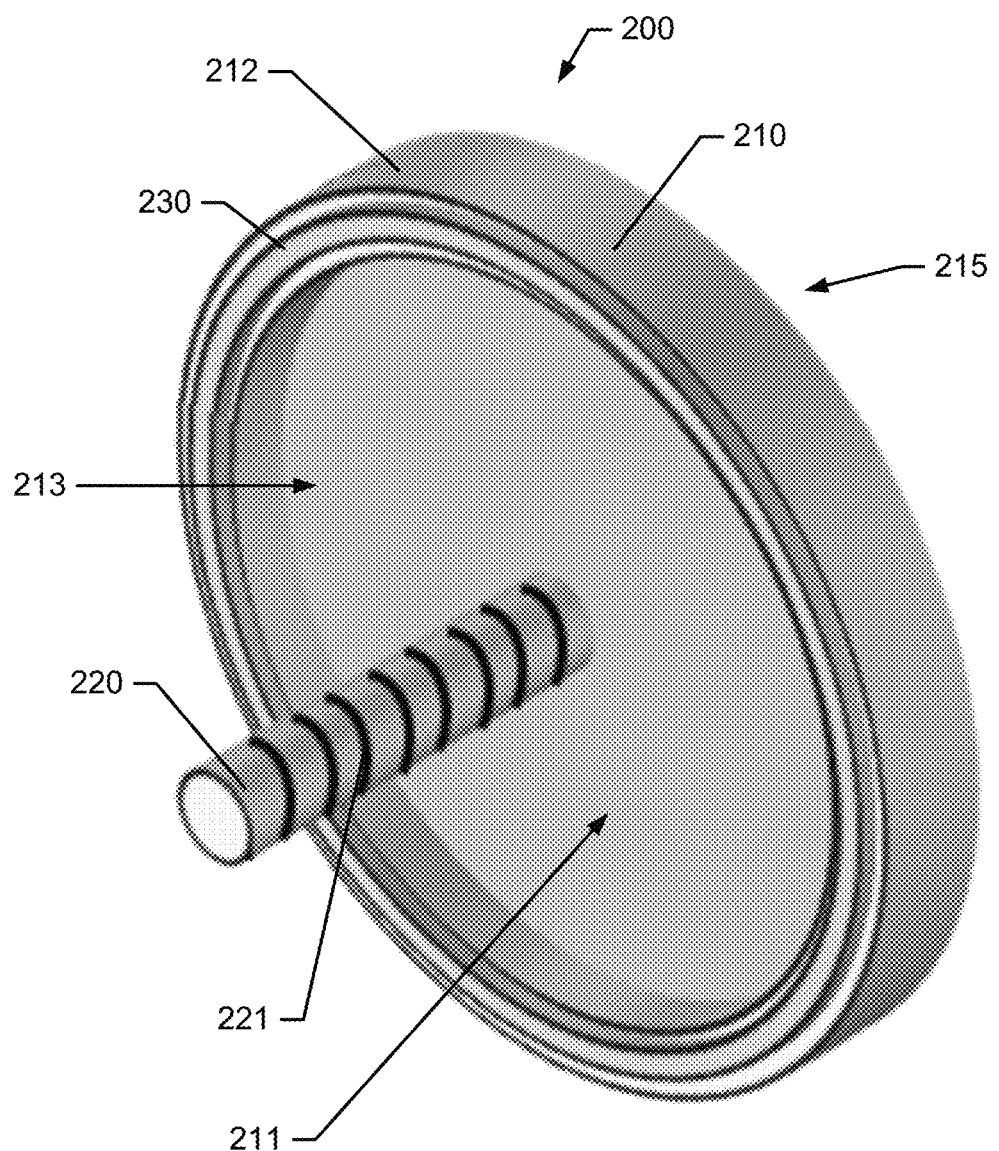
FIG. 5 illustrates a perspective view of an interior side of a fastener according to an example embodiment.
Figure 6:
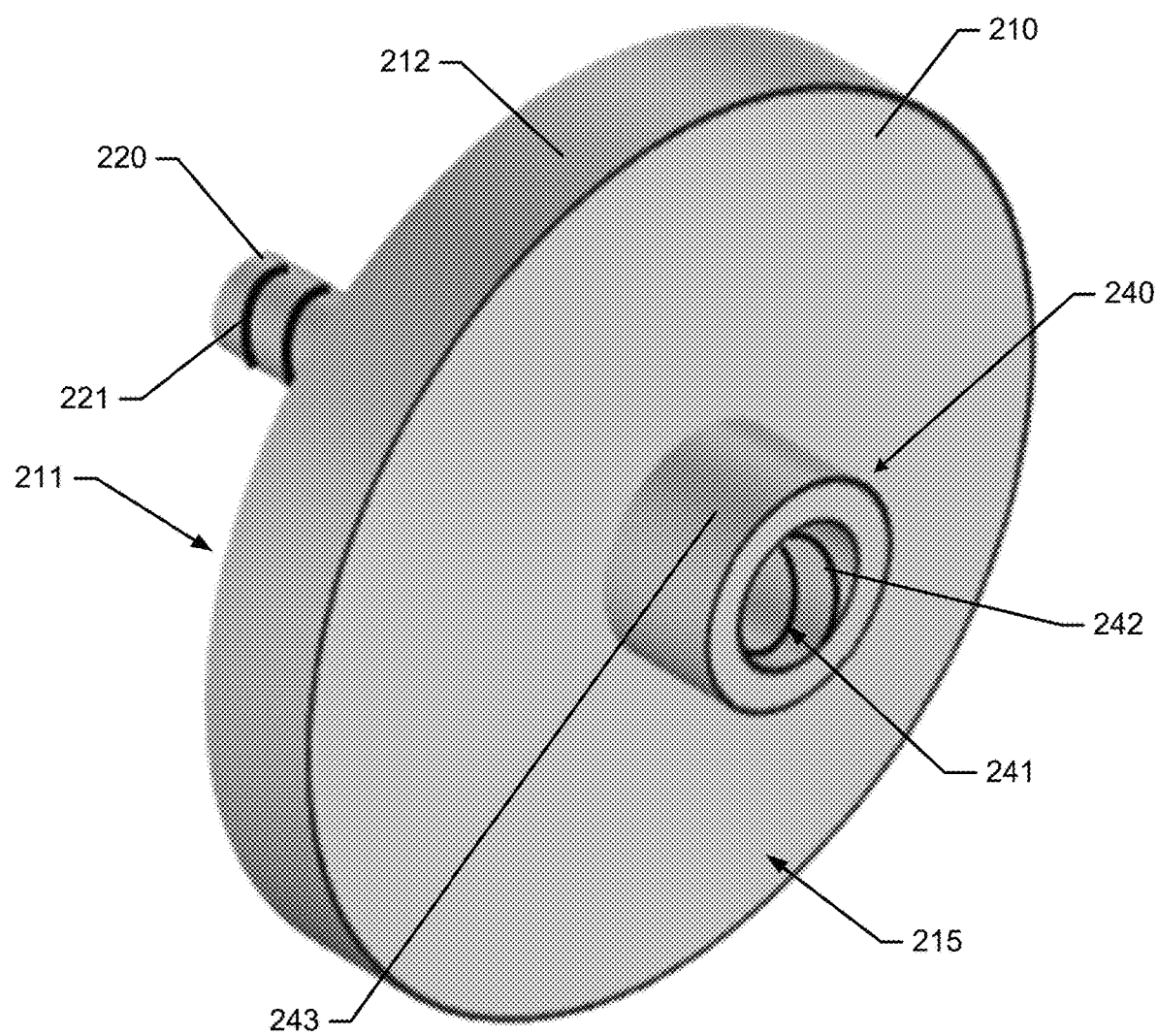
FIG. 6 illustrates a perspective view of an exterior side of a fastener according to an example embodiment.

In this regard, FIGS. 4 through 6 illustrate an example embodiment of an example fastener 200 that may be used for installing fixtures on a shielded receiving surface, while maintaining the EMI characteristics of the shielding. According to some example embodiments, the fastener 200 may comprise a head 210, a shank 220, and a seal 230.

The head 210 of the fastener 200 may be formed of an electrically conductive material. According to some example embodiments, the head 210 may be formed with a generally planar interior side 211, possibly with some protruding features. The exterior side 215 of the head 210 may take a variety of forms, such as for example, a dome, but a generally planar form may also be used as shown. The head 210 may be substantially wider than, for example, the shank 220 to facilitate a wide distribution of the force placed on the receiving surface when the fastener 200 is installed. The width of the head 210 may be a function of an engineered insert 400 that may be inserted into the head 210 as further described below. The width of the head 210 may also be selected based on the load or weight that the fastener 200 is rated to hold. In this regard, a fastener 200 that is rated for a heavier load may have a head 210 with a larger width in order to offer a wider distribution of loading on the receiving surface when the fastener 200 is supporting a heavy load. Additionally, the shape of head 210 may be circular, although other shapes such as a square or rectangle may also be utilized. An interior side 211 and an exterior side 215 of the head 210 may be defined. In this regard, the interior side 211 is defined as the wall/receiving surface-facing side of the head 210 when the fastener 200 is installed on a wall, or the side of the head 210 from which the shank 220 extends. The exterior side 215 of the head 210 is defined as the side of the head 210 that faces away from the wall/receiving surface when the fastener 200 is installed, or the side of the head 210 opposite of the side from which the shank 220 extends.

According to some example embodiments, the head 210 may include a protrusion 212 on the interior side 211 of the head 210 that extends away from the interior side 211 and, when installed, extends towards the receiving surface. According to some example embodiments, the protrusion 212 may form a cup-shape for the head 210 that includes a cavity 213 that opens towards the receiving surface. The protrusion 212 may be a continuous loop (e.g., a ring) and may be disposed about an edge of the interior side 211 of the head 210. In this regard, the protrusion 212 may be disposed about a perimeter of the interior side 211 of the head 210. Accordingly, the protrusion 212 may form a lip on the interior side 211 of the head 210.

A shank 220 may extend from the interior side 211 of the head 210. According to some example embodiments, the shank 220 may extend from a central point on the interior side 211 of the head 210, and may extend in a substantially orthogonal direction to the surface of the interior side 211 of the head 210. In example embodiments where the head 210 includes the protrusion 212, the shank 220 may extend from within the cavity 213 formed by the protrusion 212. The shank 220 may be formed of an electrically conductive material and may include a sharp point 222 for piercing into a receiving surface to which the fastener 200 may be applied, or, in some example embodiments, the tip of the shank 220 may be blunt. The shank 220 may also include threading 221 that is configured to facilitate driving and holding the shank 220 in a receiving surface to which the fastener 200 may be applied. The threading 221 may run from the tip of the shank 220 to the head 210, or the threading 221 may run from the tip of the shank and stop some distance from the head 210 leaving an unthreaded portion of the shank 220. The shank 220 may, for example, have a circular cross-section and the shank 220 may define a width of the shank 220. The width of the shank 220 may be selected based on the load or weight that the fastener 200 is rated to hold. In this regard, a fastener 200 that is rated for a heavier load may have a shank 220 with a larger width (or diameter in example embodiments where the shank 220 has a circular cross-section).

The fastener 200 may also include a seal 230. The seal 230 may be formed of an electrically conductive material having a relatively small resistance. According to some example embodiments, the seal 230 may be formed of a material that has some degree of elasticity, thereby facilitating the ability of the seal 230 to be fully seated (i.e., physically contacting around the entire seal 230) on a receiving surface when the fastener 200 is installed. The seal 230 may be formed as a loop (e.g., a ring) and be disposed on, and be in electrical contact with, the interior side 211 of the head 210 of the fastener 200. In this regard, according to some example embodiments, the seal 230 may be disposed on the protrusion 212 and extend away from the interior side 211 and, when installed, towards a receiving surface (e.g., wall). As such, according to some example embodiments, the protrusion 212 may assist to ensure that the seal 230 (and possibly the shank 220) may be the only portion of the fastener 200 that physically contacts the receiving surface, when the fastener 200 is installed. In this regard, to ensure physical contact of the seal 230, for example, with an uneven wall surface, the seal 230 may be formed to have a sufficient thickness and elasticity to allow for such wall surface variations.

According to some example embodiments, the fastener 200 may also include a fixture attachment member 240 on the exterior side 215 of the head 210. In this regard, according to some example embodiments, the fixture attachment member 240 may include a fixture protrusion 243 that extends away from the exterior side 215 of the head 210 and may operate to increase a depth of a fixture bore 241 that may be a component of the fixture attachment member 240. According to some example embodiments, the fixture bore 241 may include internal threading 242. The fixture bore 241 may be configured to receive a hook, hanger, or other fixture accessory that may be disposed within the fixture bore 241, to facilitate, for example, hanging a picture or the like on a shielded wall. According to some example embodiments, the fixture bore 241 may also be leveraged to assist with driving the fastener 200 into a receiving surface by providing a feature that may interface with, for example, a screwdriver or drill that can be used to drive the fastener 200 into a receiving surface. In this regard, the fixture bore 241 may include slots or other features that facilitate interfacing with a Phillips head, flat blade, or other type of driver. According to some example embodiments, rather than the fixture attachment member 240 including a bore, the fixture attachment member 240 may comprise, for example, a protruding peg that may be threaded, an eyelet, a snap, a slide-in notch, or the like.

Figure 7:
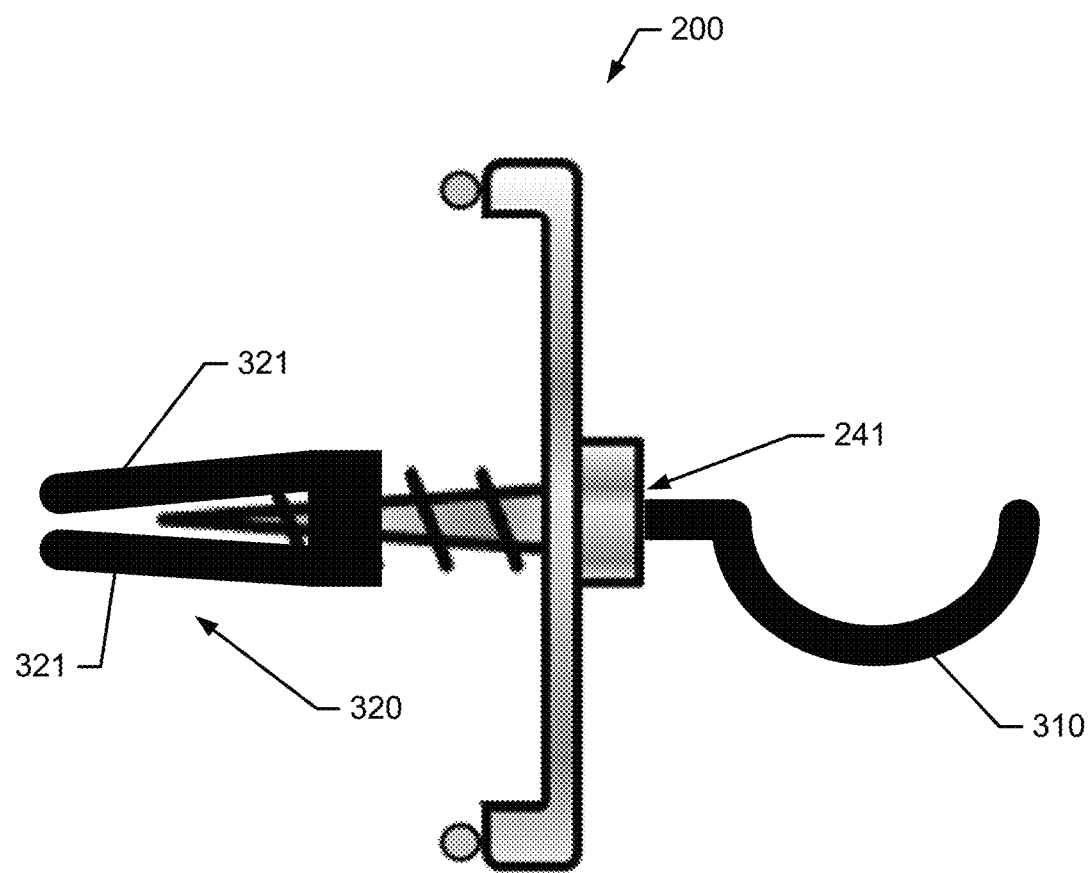
FIG. 7 illustrates a cross-section side view of a fastener with a fixture accessory and an expanding anchor according to an example embodiment.

In this regard, FIG. 7 illustrates another example embodiment of the fastener 200 with a fixture accessory. In this regard, the fixture accessory is a hook 310 that is disposed in (e.g., screwed into) the fixture attachment member 240, which in this case includes a fixture bore 241. While the hook 310 shown in FIG. 7 is one example of a fixture accessory, other fixture accessories may alternatively be used, such as, for example, clothing pegs, eyelets, screws and other fasteners to support shelving, magnetic supports, or the like.

Additionally, according to some example embodiments, the fastener 200 may include an expanding anchor 320. An expanding anchor 320 may be used in situations where the fastener 200 will not be installed at a location of a wall stud or other solid framing in the receiving surface. For example, in circumstances where the fastener 200 is installed in a drywall sheet, a fastener 200 with an expanding anchor 310 may be used. The expanding anchor 310 may be comprised of, for example, a bendable plastic substance. The expanding anchor 310 may have arms 321 that deflect away from the shank 220 as the shank 220 is screwed into the expanding anchor 320. The deflected arms 321 may be located on an interior side of the receiving surface and therefore the presence of the expanding anchor 320 may create a stronger hold onto the receiving surface.

According to some example embodiments, the fastener 200 may also include an insert 400 as shown in FIGS. 8 and 9. The insert 400 may provide the fastener 200 with an improved ability to absorb or attenuate RF waves. In this regard, the insert 400 may comprise an electromagnetic absorber or a surface wave attenuator, each of which may be comprised of RF absorbing elastomers or foams. In some example embodiments, the electromagnetic absorber or surface wave attenuator may be comprised of, for example, polymeric materials filled with magnetic particles formed into an EMI noise suppression sheet. According to some example embodiments, the insert 400 may be comprised of an open celled foam impregnated with a carbon coating. The insert 400 may be shaped to conform to the cavity 213 and fit into the cavity 213. In this regard, the insert 400 may include an opening 401 through which the shank 220 may pass. According to some example embodiments, while the insert 400 may be disposed within the cavity 213, the thickness of the insert 400 may be the same or less than the depth of the cavity 213 to prevent the insert 400 from contacting the receiving surface, and, thus, the shank 220 and seal 230 may be the only portions of the fastener 200 that contact the receiving surface.

According to some example embodiments, the maximum diameter of the shank 220 (or width of the shank 220) and therefore the maximum diameter of the pierced hole made in the receiving surface, which may be the conductive layer 140, by the shank 220, may be one-half (½) inch. Electromagnetic energy having a wavelength comparable to the circumference of the pierced hole may be coupled, and often times efficiently coupled, through the pierced hole in the conductive layer 140. However, the amount of energy coupled through the pierced hole falls off or is reduced dramatically as the wavelength of the electromagnetic energy exceeds the circumference of the pierced hole. Accordingly, free-space absorption and surface wave attenuation that may be performed by the insert 400 may be engineered to improve or optimize its effectiveness at wavelengths that are near the same value (i.e., length) as the circumference of the pierced hole. The following Table 1 provides examples of some circumferences and associated target wavelengths.

TABLE 1

| Pierced Hole Diameter (Inches) | Circumference (Centimeters) | Target Wavelength (Centimeters) | Target Frequency (Giga-Hertz) |
|---|---|---|---|
| ¼ | 2 | 2 | 15 |
| ⅜ | 3 | 3 | 10 |
| ½ | 4 | 4 | 7.5 |

According to some example embodiments, the frequencies indicated in Table 1 may be at the upper range of those required to be attenuated or absorbed, thereby allowing thinner absorbers and surface wave attenuators. As such, the thinner absorbers and surface wave attenuators may be used as inserts 400 to support a larger shielding system, and therefore the cavity 213 of the fastener 200 may be similarly thin, avoiding the need for a bulky head and fastener. The relatively short wavelengths also reduce the diameter of a surface wave attenuator material to be implemented around the pierced hole to obtain the desired attenuation. As such, if the pierced hole is ¼ inch in diameter, a one wavelength surface wave attenuator may be 2 centimeters wide, thereby requiring the cavity 213 within the head 210 of the fastener 200 (and also the head 210 itself) to be approximately 4 centimeters or 1.5 inches in diameter or larger. Similarly, for a ½ inch in diameter pierced hole, a one wavelength surface wave attenuator may be 4 centimeters wide, thereby requiring the cavity 213 within the head 210 of the fastener 200 (and also the head 210 itself) to be approximately 8 centimeters or 3 inches in diameter or larger. Accordingly, the cavity 213 may be sized sufficiently to receive and hold an absorber or surface wave attenuator that has been engineered based at least on the diameter of the shank 220 and the resulting pierced hole interior side 211 in the conductive layer 140. Accordingly, since the cavity 213 is disposed within the head 210, the head 210 may also be required to have at least this requisite diameter in order to support the sizing requirements of the insert 400.

According to some example embodiments, an example method of installing a fastener, such as fastener 200, is provided in FIG. 10 and depicted in FIGS. 11 through 14. The example method may be performed on a receiving surface having metamaterial shielding affixed thereto in a manner that maintains electromagnetic interference characteristics of a metamaterial shielding. The example method may be performed by an installer of the fastener 200 on, for example, a wall that has metamaterial shielding as described with respect to FIG. 3.

As such, at 500, the example method may include cutting and removing an outer sheathing layer 110 and a patterned conductive layer 120 from a target area of the metamaterial shielding (i.e., the metamaterial-based EMI shielding 100). In this regard, the shape of the cut and removed layers of the metamaterial-based EMI shielding 100 may the same or substantially the same as the shape of the head 210 of the fastener 200. For example, in instances where the head 210 of the fastener 200 is circular, the removed area may be shaped as a circle having substantially the same area and diameter as the area and diameter of the head 210. Accordingly, a circular cutter 600 may be used to cut the outer sheathing layer 110 and the patterned conductive layer 120 at the target area as shown in FIG. 11. According to some example embodiments, the operation of cutting the metamaterial-based EMI shielding 100 may be performed only to a depth that does not contact or otherwise damage the conductive layer 140. FIG. 13 illustrates the state of the metamaterial-based EMI shielding 100 and the wall 150 after the outer sheathing layer 110 and the patterned conductive layer 120 is cut and removed.

The example method may continue, and include at 510, removing a dielectric layer 130 from the target area of the metamaterial shielding (i.e., metamaterial-based EMI shielding 100) while maintaining a conductive layer 140 of the metamaterial shielding. In this regard, according to example embodiments, care may be needed to ensure that removal of the dielectric layer 130 does not damage the conductive layer 140. Since, according to some example embodiments, the dielectric layer 130 may be formed of, for example, a foam or other soft substance, precision soft tools (e.g., hand tools such as a knife) may be used to extract the dielectric layer 130, as shown in FIG. 13. After removal of the dielectric layer 130, in some example embodiments, the example method may further include removing any adhesive or other particulate from the now exposed surface of the conductive layer 140 using a cleaner or solvent.

The example method may further include, at 520, driving a shank 220 of the fastener 200 into and through the conductive layer 140 of the metamaterial shielding (i.e., metamaterial-based EMI shielding 100) and into the receiving surface 150 at the target area. In this regard, the fastener 200 may be driven by a user with a screwdriver, a hand wrench, a power driver, or the like. The shank 220 may be driven directly into the conductive layer 140 and the receiving surface 150 or, according to some example embodiments, an expanding anchor 320 may be utilized. According to some example embodiments, driving the shank 220 and the fastener 200 may include rotating or turning the fastener 200 such that threading 221 of the shank 220 engages with the materials of the receiving surface 150. FIG. 13, in this regard, shows the fastener 200 moving in the direction of the arrow and into engagement with the conductive layer 140 to subsequently be driven into the conductive layer 140 and the receiving surface 150.

The example method may further include seating the conductive seal 230 on the conductive layer 140 of the metamaterial shielding (i.e., metamaterial-based EMI shielding 100) such that the fastener 200 physically contacts the conductive layer only via the conductive seal 140 and the shank 220. In this regard, as shown in FIG. 14, the shank 220 of the fastener 200 has been driven through the conductive layer 140 and into the receiving surface 150. The fastener 200 has been tightened into position such that the seal 230 is fully seated on the conductive layer 140 forming an electrical connection between the conductive layer 140 and the seal 230 around the entirety of interior surface of the seal 230. According to some example embodiments, the seal 230 may be disposed on a protrusion 212 on the interior side 211 of the head 210, which may be loop-shaped and form a cavity 213 on the interior side 211 of the head 210. Note that, for example, due to the elasticity of the seal 230, the seal 230 may become deformed due to the pressure applied by the head 210. However, even with the deformation of the seal, according to some example embodiments, the remainder of the head 210 may not be in contact with the conductive layer 140. Accordingly, the conductive seal 230 and the head 210 form a continuous conductive path around the hole in the conductive layer 140 formed by the shank 220. As described above, further isolation may be provided by incorporating an insert 400 into the fastener 200, which may include, for example, an electromagnetic absorber configured to absorb a radio frequency wave of a given frequency or a surface wave attenuator configured to attenuate a radio frequency wave of a given frequency. The insert 400 may include an opening 401 through which the shank 220 passes. In the seated position, with the seal 230 seated on the conductive layer 140, the fastener 200 may now be properly configured to receive a fixture accessory, such as, for example, a hook from which to hang a picture frame.

Example embodiments of the fastener 200 have been described in the context of applications involving use of the fastener 200 on receiving surfaces that include metamaterial shielding. However, one of skill in the art would appreciate that the example embodiments of the fastener 200 would also be useful in the context of a Faraday cage shielding approach that involves covering the receiving surface with only a conductive material (e.g., conductive foil). Such conductive material may be formed similar to the conductive layer 140 as described above, however, in the absence of the other layers that form the metamaterial. Leakage due to piercings in the Faraday cage conductive material are similarly problematic and can result in degrading the effectiveness of the shielding system, which may be remedied through use of the example embodiments of the fastener 200 described herein.

Many modifications and other embodiments of the measuring device set forth herein will come to mind to one skilled in the art to which these inventions pertain having the benefit of the teachings presented in the foregoing descriptions and the associated drawings. Therefore, it is to be understood that the measuring devices are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

What is claimed is:

1. A fastener configured to maintain electromagnetic interference characteristics of metamaterial shielding, the fastener comprising:
 a head including an interior side and an exterior side;
 a threaded shank extending from the interior side of the head and configured to be driven into a receiving surface; and
 a seal being formed as a loop and disposed on the interior side of the head, the seal comprising a conductive material.

2. The fastener of claim 1, wherein the interior side of the head comprises a protrusion, and wherein the seal is disposed on the protrusion.

3. The fastener of claim 2, wherein the protrusion is loop-shaped and forms a cavity on the interior side of the head.

4. The fastener of claim 3, further comprising an insert disposed within the cavity and including an opening through which the shank passes.

5. The fastener of claim 4, wherein the insert is configured to attenuate or absorb a radio frequency wave of a given frequency.

6. The fastener of claim 1, further comprising a bore disposed on the exterior side of the head.

7. The fastener of claim 6, wherein the bore is threaded.

8. A fastener configured to maintain electromagnetic interference characteristics of metamaterial shielding, the fastener comprising:
- a circular head including an interior side and an exterior side;
- a threaded bore disposed on the exterior side of the head;
- a shank extending from the interior side of the head and configured to be driven into a receiving surface, at least a portion of the shank being threaded; and
- a seal being formed as a loop and disposed along a perimeter of the interior side of the head, the seal comprising a conductive material.

9. The fastener of claim 8, wherein
the interior side of the head comprises a ring-shaped protrusion, and
the seal is disposed on the ring-shaped protrusion.

10. The fastener of claim 9, wherein
the ring-shaped protrusion forms a cavity on the interior side of the head, and
the fastener further comprises an insert disposed within the cavity and including an opening through which the shank passes.

11. The fastener of claim 10, wherein the insert is configured to attenuate or absorb a radio frequency wave of a given frequency.

12. A method for installing a fastener on a receiving surface including metamaterial shielding affixed to the receiving surface, the fastener being installed in a manner that maintains electromagnetic interference characteristics of a metamaterial shielding, the method comprising:
- cutting and removing an outer sheathing layer and a patterned conductive layer from a target area of the metamaterial shielding;
- removing a dielectric layer from the target area of the metamaterial shielding while maintaining a conductive layer of the metamaterial shielding positioned behind the dielectric layer;
- driving a threaded shank of the fastener into and through the conductive layer of the metamaterial shielding and into the receiving surface at the target area, wherein the fastener comprises a head, the threaded shank, and a conductive seal, the head including an interior side and an exterior side, the threaded shank extending from the interior side of the head, and the conductive seal being formed as a loop and disposed on the interior side of the head; and
- seating the conductive seal of the fastener on the conductive layer of the metamaterial shielding such that the fastener physically contacts the conductive layer only via the conductive seal and the shank.

13. The method claim 12, wherein cutting and removing the outer sheathing layer and the patterned conductive layer from the target area of the metamaterial shielding includes the target area being a same size and shape as the head of the fastener.

14. The method of claim 12, wherein
the driving the shank of the fastener into and through the conductive layer of the metamaterial shielding and into the receiving surface at the target area includes turning the fastener and the shank.

15. The method of claim 12, wherein
the interior side of the head of the fastener comprises a protrusion, and
the seal is disposed on the protrusion.

16. The method of claim 15, wherein the protrusion is loop-shaped and forms a cavity on the interior side of the head.

17. The method of claim 16, wherein the fastener further comprises an insert disposed within the cavity and including an opening through which the shank passes.

18. The method of claim 16, wherein the insert is configured to attenuate or absorb a radio frequency wave of a given frequency.

* * * * *